(12) United States Patent
Yoshioka et al.

(10) Patent No.: US 7,492,595 B2
(45) Date of Patent: Feb. 17, 2009

(54) SEMICONDUCTOR COOLING DEVICE AND STACK OF SEMICONDUCTOR COOLING DEVICES

(75) Inventors: Hokichi Yoshioka, Tokyo (JP); Takayuki Yamaoka, Tokyo (JP); Satoshi Senoo, Tokyo (JP)

(73) Assignee: Tecnisco Limited, Tokyo (JP)

( * ) Notice: Subject to any disclaimer, the term of this patent is extended or adjusted under 35 U.S.C. 154(b) by 0 days.

(21) Appl. No.: 12/073,877

(22) Filed: Mar. 11, 2008

(65) Prior Publication Data

US 2008/0165500 A1 Jul. 10, 2008

Related U.S. Application Data

(62) Division of application No. 11/094,191, filed on Mar. 31, 2005, now Pat. No. 7,365,986.

(51) Int. Cl.
*H05K 7/20* (2006.01)
(52) U.S. Cl. .......................... 361/699; 165/46; 257/714
(58) Field of Classification Search ......... 361/699–700; 165/46, 104.26; 257/714–715
See application file for complete search history.

(56) References Cited

U.S. PATENT DOCUMENTS

| | | | |
|---|---|---|---|
| 4,559,580 A | | 12/1985 | Lutfy |
| 4,894,709 A | * | 1/1990 | Phillips et al. ............... 257/714 |
| 5,098,305 A | | 3/1992 | Krajewski et al. |
| 5,293,070 A | * | 3/1994 | Burgess et al. ............... 257/714 |
| 5,665,166 A | | 9/1997 | Deguchi et al. |
| 5,665,473 A | | 9/1997 | Okoshi et al. |
| 5,901,037 A | * | 5/1999 | Hamilton et al. ............ 361/699 |
| 5,998,240 A | * | 12/1999 | Hamilton et al. ............ 438/122 |
| 6,459,581 B1 | * | 10/2002 | Newton et al. ............... 361/700 |
| 7,114,550 B2 | | 10/2006 | Nakahama et al. |
| 2003/0051859 A1 | * | 3/2003 | Chesser et al. ................ 165/46 |
| 2006/0002087 A1 | * | 1/2006 | Bezama et al. .............. 361/699 |
| 2006/0108100 A1 | | 5/2006 | Goldman et al. |
| 2007/0095507 A1 | * | 5/2007 | Henderson et al. ...... 165/104.26 |
| 2007/0256810 A1 | * | 11/2007 | Di Stefano et al. ............ 165/46 |

FOREIGN PATENT DOCUMENTS

JP 11-097770 4/1999

\* cited by examiner

*Primary Examiner*—Jayprakash N Gandhi
*Assistant Examiner*—Courtney L Smith
(74) *Attorney, Agent, or Firm*—Wenderoth, Lind & Ponack, L.L.P.

(57) ABSTRACT

To prevent occurrence of distortion in a semiconductor cooling device and to prevent a semiconductor chip from being separated away from the semiconductor cooling device in case the semiconductor chip and the semiconductor cooling device are thermally expanded, a semiconductor cooling device includes at least an upper plate, an intermediate plate and a lower plate, and has a coolant inlet portion, an outlet portion and a flow passage portion. The upper plate and the lower plate are composite plates constituted by plating copper maintaining a thickness of not smaller than 0.05 mm on one surface or on both surfaces of auxiliary plates made of a material having a tensile strength of not smaller than 1000 N/mm$^2$, a heat conductivity of not smaller than 100 W/m·K and a coefficient of thermal expansion of not larger than 6.0 ppm/° C.

5 Claims, 7 Drawing Sheets

SEMICONDUCTOR COOLING DEVICE AND STACK OF SEMICONDUCTOR COOLING DEVICES

This application is a divisional application of application Ser. No. 11/094,191 filed Mar. 31, 2005, now U.S. Pat. No. 7,365,986.

BACKGROUND OF THE INVENTION

1. Field of the Invention

The present invention relates to a semiconductor cooling device to cool a semiconductor chip such as a semiconductor laser diode or the like, and a stack of semiconductor cooling devices obtained by stacking a plurality of the cooling devices.

2. Related Art

A water cooling type of semiconductor cooling device called a water jacket is mounted on a semiconductor chip such as a semiconductor laser diode or the like that generates heat. The semiconductor chip in use is cooled by the semiconductor cooling device to maintain the function of the semiconductor chip.

For example, JP-A-11-97770 discloses a semiconductor cooling device which is constituted by integrally forming an upper plate, an intermediate plate and a lower plate which are made of copper relying upon a diffusion junction or a solder junction, forming a cooling water inlet portion, a cooling water outlet portion and a cooling water flow passage portion, and permitting the cooling water to flow in through the inlet portion, to flow through the flow passage portion and to flow out from the outlet portion to thereby efficiently cool the semiconductor chip.

However, the plates made of copper have a low rigidity. Therefore, when the semiconductor cooling devices are stacked in a plural number and when the semiconductor laser diodes are mounted on these semiconductor cooling devices in an attempt to obtain an increased laser beam output, the semiconductor cooling devices being coupled together by using bolts, a problem arises in that the semiconductor cooling devices are distorted due to the fastening forces of bolts adversely affecting the directivity of the laser beams. Besides, if the semiconductor cooling device is not stacked, a distortion that happens to occur in the semiconductor cooling device adversely affects the directivity of the laser beam.

Besides, copper which is the material forming the plates, has a high coefficient of thermal expansion which is greatly different from the coefficient of thermal expansion of the material of the semiconductor chip such as gallium arsenide. Due to the heat generated by the semiconductor chip, therefore, there arises a problem in that the. semiconductor chip separates away from the semiconductor cooling device after the passage of time.

SUMMARY OF THE INVENTION

The present invention therefore tries to prevent occurrence of distortion in the semiconductor cooling device and to prevent the semiconductor chip from being separated away from the semiconductor cooling device when the semiconductor chip and the semiconductor cooling device are thermally expanded.

The present invention is concerned with a semiconductor cooling device to cool a semiconductor chip, including at least an upper plate, an intermediate plate and a lower plate, and having a coolant inlet portion, an outlet portion and a flow passage portion, wherein the upper plate and the lower plate are composite plates constituted by plating copper maintaining a thickness of not smaller than 0.05 mm on one surface or on both surfaces of auxiliary plates made of a material having a tensile strength of not smaller than 1000 N/mm$^2$, a heat conductivity of not smaller than 100 W/m·K and a coefficient of thermal expansion of not larger than 6.0 ppm/° C.

It is preferable that copper is plated maintaining a thickness of 0.1 mm to 0.5 mm, and the auxiliary plates have a thickness of 0.1 mm to 0.5 mm. A material that satisfies the conditions of the tensile strength, heat conductivity and coefficient of thermal expansion related to the auxiliary plates may be, for example, molybdenum to which only, however, the material is not limited. When the semiconductor chip is constituted by using gallium arsenide, it is preferable that the auxiliary plates are constituted by using molybdenum.

When the intermediate plate is made of copper, i is preferable that a symmetrical constitution is realized in the top-and-down direction with the intermediate plate as a center in a manner that the copper-plated surfaces of the composite plates are exposed to the outer sides.

The invention further provides a stack of semiconductor cooling devices obtained by stacking a plurality of the semiconductor cooling devices, fastening them together by bolts, and mounting the semiconductor laser diodes as semiconductor chips on the semiconductor cooling devices.

According to the present invention, the upper plate and the lower plate are composite plates obtained by plating copper maintaining a thickness of not smaller than 0.05 mm on one surface or on both surfaces of auxiliary plates which are made of a material having a tensile strength of not smaller than 1000 N/mm$^2$, a heat conductivity of not smaller than 100 W/m·K and a coefficient of thermal expansion of not larger than 6.0 ppm/° C., thereby offering a high heat conductivity, a good cooling efficiency, a high rigidity without developing distortion and, hence, without adversely affecting the operation of the semiconductor chip. When the semiconductor chip is a semiconductor laser diode, in particular, it is possible to maintain the semiconductor laser diode in a predetermined direction without developing error in the directivity of the laser beam since the auxiliary plates are not distorted. Besides, the coefficient of thermal expansion of the auxiliary plates is dose to the coefficient of thermal expansion of the semiconductor device. Even when heat is generated by the semiconductor chip, therefore, the semiconductor chip is not separated away even after the passage of time.

If the thickness of the copper plating is selected to be 0.1 mm to 0.5 mm and the thickness of the auxiliary plate is selected to be 0.1 mm to 0.5 mm, there is obtained a suitable degree of strength without distortion.

The auxiliary plates made of molybdenum can be easily worked and are economical because of their low prices.

When the auxiliary plates are made of molybdenum and the semiconductor chip is made of gallium arsenide, the coefficient of thermal expansion of gallium arsenide is 5.9 ppm/° C. while the coefficient of thermal expansion of molybdenum is as low as 5.1 ppm/° C. making it possible to suppress the thermal expansion of copper of which the coefficient of thermal expansion is 17.0 ppm/° C. Therefore, the semiconductor chip is not separated from the semiconductor cooling device even after the passage of time.

When the intermediate plate is made of copper, and the copper-plated surfaces of the composite plates constituting the upper plate and the lower plate are exposed to the outer sides, the constitution becomes symmetrical in the up-and-down direction with copper of the intermediate plate as a center. Therefore, the bimetal effect is cancelled, and curvature of the semiconductor cooling device as a whole is avoided, preventing adverse effect on the operation of the semiconductor chip.

According to the stack of semiconductor cooling devices obtained by stacking a plurality of the semiconductor cooling devices and by fixing them together by bolts, the individual semiconductor cooling devices are not distorted by the fastening force of bolts. When the semiconductor laser diodes are mounted on the semiconductor cooling devices, therefore, it is possible to increase the output while maintaining the directivity of the laser beams.

DETAILED DESCRIPTION OF PREFERRED EMBODIMENT

Figure 1:
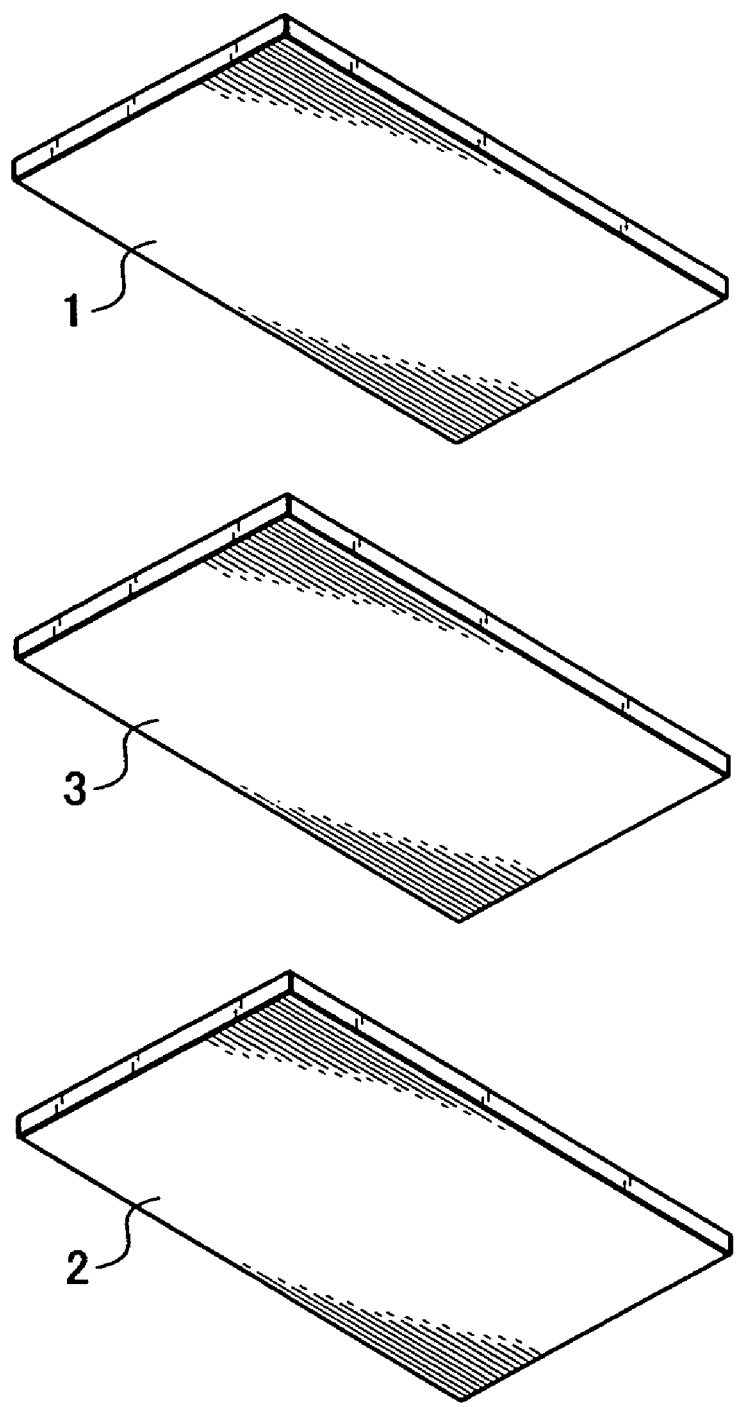
FIG. 1 is a perspective view showing two auxiliary plates and an intermediate plate.

A semiconductor cooling device according to the invention is produced by using two auxiliary plates (first and second plates) 1, 2 and an intermediate plate 3 shown in FIG. 1. The auxiliary plates 1 and 2 are made of a material having a tensile strength of not smaller than 1000 N/mm$^2$, a heat conductivity of not smaller than 100 W/m·K and a coefficient of thermal expansion of not larger than 6.0 ppm/° C. As the materials that satisfy all of the conditions of tensile strength, heat conductivity and coefficient of thermal expansion, there can be exemplified molybdenum, copper-tungsten and the like. Molybdenum has a tensile strength of 1370 N/mm$^2$, a heat conductivity of 139 W/m·K and a coefficient of thermal expansion of 5.1 ppm/° C. On the other hand, copper-tungsten containing copper in an amount of 2% to 10% as a volume ratio, has a tensile strength of 3322 N/mm$^2$ to 3630 N/mm$^2$, a heat conductivity of 180 W/m·K to 200 W/m·K and a coefficient of thermal expansion of 6.0 ppm/° C. to 8.0 ppm/° C.

The auxiliary plates 1 and 2 have a thickness of, for example, about 0.1 mm to about 0.5 mm. The intermediate plate 3 is made of a material having good heat conductivity, such as copper and has a thickness of, for example, about 0.3 mm.

Figure 2:
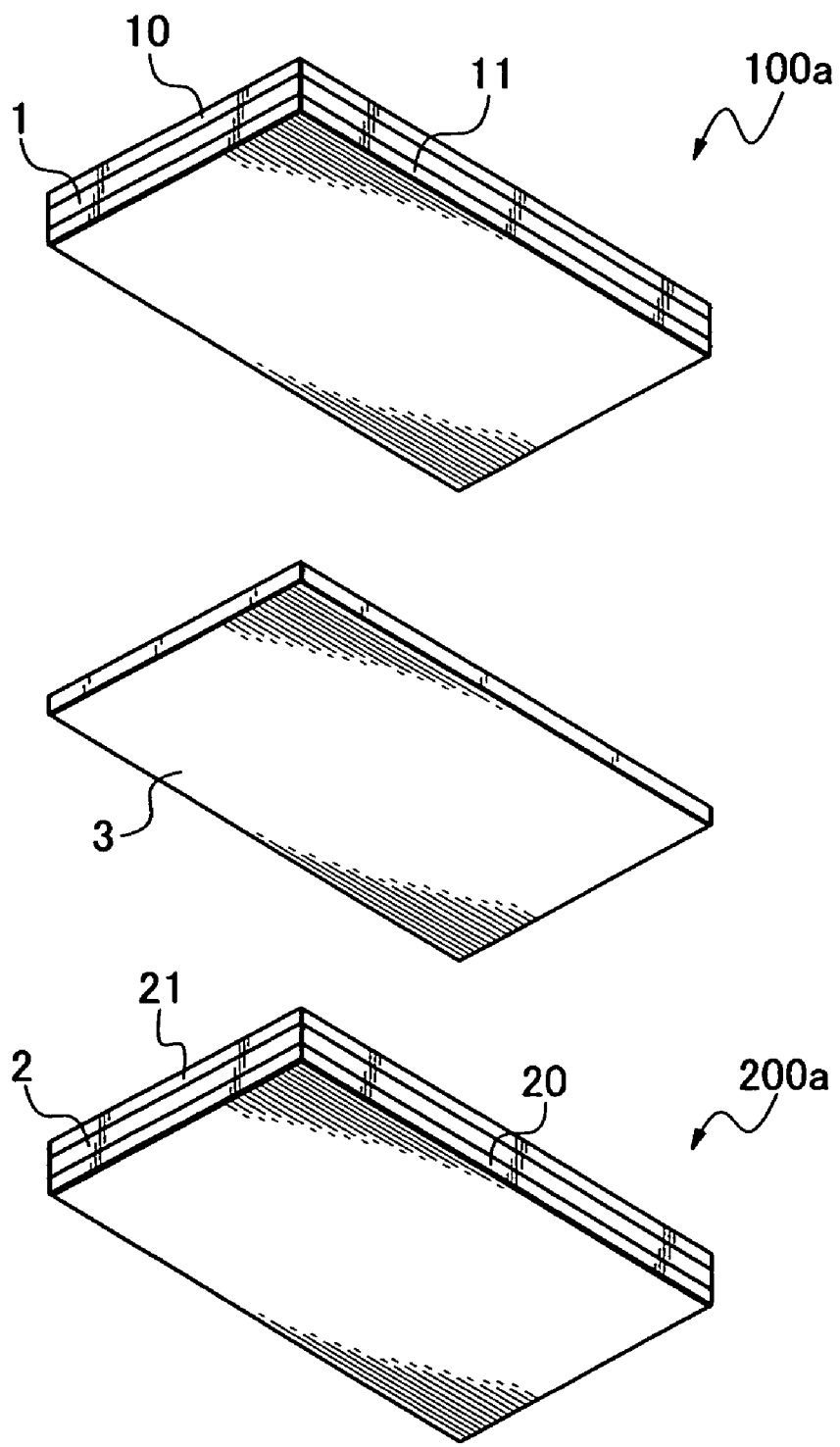
FIG. 2 is a perspective view showing an upper plate and a lower plate obtained by plating the auxiliary plates, and the intermediate plate.

Copper is plated maintaining a thickness of not smaller than 0.05 mm on one or both surfaces of the two pieces of auxiliary plates 1 and 2 to form composite plates. FIG. 2 illustrates a case where copper is plated on both surfaces of the auxiliary plates 1 and 2 as designated at 10, 11, 20 and 21. In the illustrated example, the auxiliary plate 1 is plated with copper as designated at 10 and 11 to constitute an upper plate 100a, and the auxiliary plate 2 is plated with copper as designated at 20 and 21 to constitute a lower plate 200a.

Figure 3A:
FIGS. 3(A), 3(B), 3(C) and 3(D) are front views showing the constitutions of the upper plate and the lower plate.
Figure 3A:
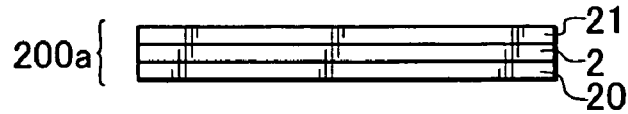
Figure 3B:
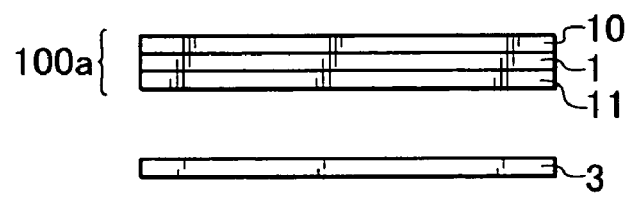
Figure 3B:
Figure 3C:
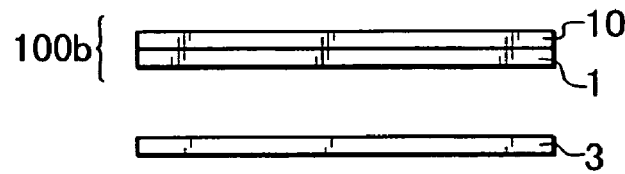
Figure 3C:
Figure 3D:
Figure 3D:

The auxiliary plates 1 and 2 may be plated with copper on the surfaces on one side thereof or on the surfaces on both sides thereof. Therefore, there are variations as shown in FIGS. 3(A) to 3(D). First, in the example of FIG. 3(A), the auxiliary plate 1 is plated with copper on both surfaces thereof as designated at 10 and 11 like in the example of FIG. 2 to constitute the upper plate 100a. The auxiliary plate 2, too, is plated with copper on both surfaces thereof as designated at 20 and 21 to constitute the lower plate 200a. In the example of FIG. 3(B), the auxiliary plate 1 is plated with copper on both surfaces thereof as designated at 10 and 11 to constitute the upper plate 100a, while the auxiliary plate 2 is plated with copper on the lower surface only thereof as designated at 20 to constitute the lower plate 200b. In the example of FIG. 3(C), the auxiliary plate 1 is plated with copper on the upper surface only thereof as designated at 10 to constitute the upper plate 100b, while the auxiliary plate 2 is plated with copper on the both surfaces thereof as designated at 20 and 21 to constitute the lower plate 200a. In the example of FIG. 3(D), the auxiliary plate 1 is plated with copper on the upper surface only thereof as designated at 10 to constitute the upper plate 100b, while the auxiliary plate 2 is plated with copper on the lower surface only thereof as designated at 20 to constitute the lower plate 200b. In any case, copper is plated as designated at 10 and 20 on the upper and lower surfaces exposed after the upper plate 1, intermediate plate 2 and lower plate 3 are joined together so as to be stacked in order of copper—auxiliary plate 1—copper—auxiliary plate 2—copper. Besides, the auxiliary plates 1 and 2 are made of the same material creating symmetry in the up-and-down direction with copper as a center. Therefore, no bimetal effect is produced to cause curving. Besides, since the upper surface of the upper plate 1 has been plated with copper, the semiconductor chip mounted on the upper plate 1 is cooled highly efficiently.

Described below is a procedure for plating the auxiliary plates 1 and 2 with copper to constitute the upper plate 100 and the lower plate 200. First, the auxiliary plates 1 and 2 are dewaxed with an alkali and are washed with water. The dewaxing with an alkali is effected by using NaOH at an electric current density of, for example, 5 A/D$^2$.

Next, as a pretreatment to effect etching, pickling the auxiliary plates is carried out with hydrochloric acid, followed by washing with water and then etching is performed on their both surfaces. The etching is for removing a strong oxide film from the auxiliary plates 1 and 2 made of molybdenum or copper-tungsten. As the etching solution, there is used a mixed acid (for example, $H_2O+HNO_3+H_2SO_4$). Both surfaces are removed by about 5 μm due to the etching.

After the etching, the auxiliary plates 1 and 2 are annealed in a hydrogen atmosphere at about 850° C. to reduce the material on the surfaces of the auxiliary plates 1 and 2, followed by a nickel strike plating to form an underlayer for increasing the strength of adhesion of copper plating that will be effected later. The nickel strike plating is conducted in a Wood's bath by using a plating solution containing nickel chloride as a chief component at an electric current density of, for example, 5 A/D$^2$, followed by washing with water and drying.

The nickel strike plating is followed by annealing to sinter the plated nickel with the material of the auxiliary plates 1 and 2, which is further followed by the nickel strike plating thereon and washing with water.

Next, both surfaces of the auxiliary plates 1 and 2 plated with nickel are plated with copper by using, for example, a copper sulfate plating solution at an electric current density of 7 A/D$^2$. Here, the plating is effected maintaining a thickness of about 0.1 mm to about 0.5 mm, for example, about 0.3 mm.

Finally, the copper-plated surfaces are flattened by using a machining center or the like to make uniform the plated thickness, and the outer peripheries are formed to obtain composite plates with copper being plated on both surfaces of the auxiliary plates 1 and 2 as shown in FIGS. 2 and 3. One of the composite plates serves as the upper plate 100a (100b) and the other one serves as the lower plate 200a (200b).

Figure 4:
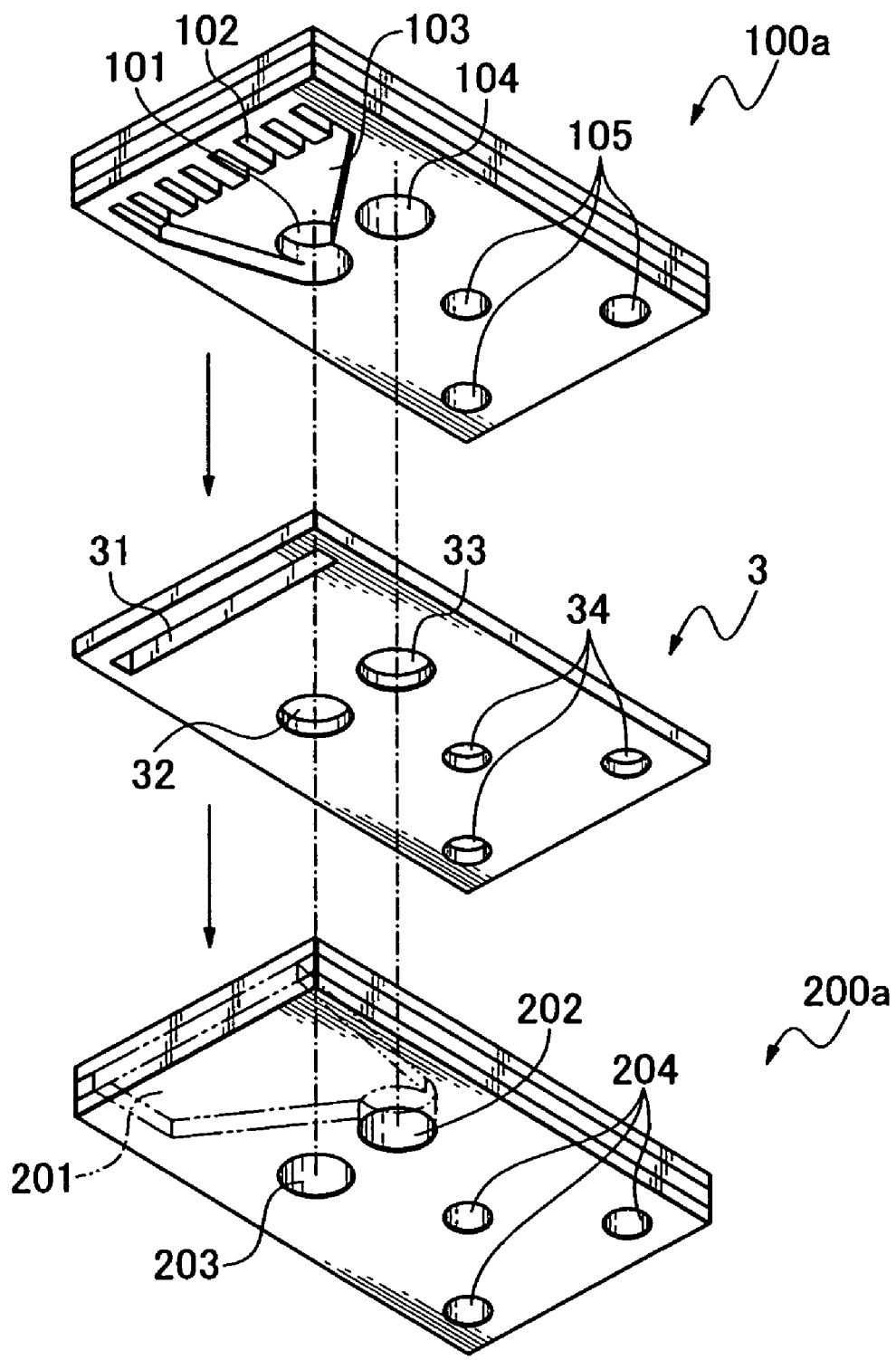
FIG. 4 is an exploded perspective view showing a semiconductor cooling device.

The upper plate 100a (100b) and the lower plate 200a (200b) are formed as described above. Thereafter, the upper plate 100a, the intermediate plate 3 and the lower plate 200a are worked by etching or by using the machining center as shown in FIG. 4 to obtain a structure for circulating coolant as well as to obtain a structure for stacking a plurality of the semiconductor cooling devices.

In the upper plate 100a, there is formed an inlet portion 101 penetrating therethrough in the up-and-down direction to serve as an inlet for the coolant. There are further formed a cooling portion 102 for really effecting the cooling by using the coolant and a flow-in passage 103 for connecting the inlet portion 101 to the cooling portion 102. The inlet portion 101 is formed in a size capable of holding a pipe for allowing the coolant to flow, and the flow-in passage 103 is formed from the inlet portion 101 toward the cooling portion 102 shaped like comb teeth.

A flow passage portion 31 that serves as a flow passage for the coolant is formed in the intermediate plate 3 penetrating therethrough in the up-and-down direction. The flow passage portion 31 is communicated with the cooling portion 102 when the intermediate plate 3 is joined to the upper plate 100a and the lower plate 200a, and plays the role of allowing the coolant to flow from the cooling portion 102 into the lower plate 200a.

In the upper surface of the lower plate 200a, there is formed a discharge passage 201 that serves as a passage for the coolant to be discharged. There is further formed an outlet portion 202 that serves as a discharge port for the coolant penetrating through the lower plate 200a in the up-and-down direction. The discharge passage 201 is communicated with the outlet portion 202, and the coolant from the flow passage portion 31 of the intermediate plate 3 flows into the outlet portion 202 through the discharge passage 201. The outlet portion 202 is so formed as to hold a pipe for discharging the coolant to the outer side.

Inlet communication holes 32 and 203 are formed in the intermediate plate 3 and in the lower plate 200a at a position corresponding to the inlet portion 101 of the upper plate 100a, and outlet communication holes 104 and 33 are formed in the upper plate 100a and in the intermediate plate 3 penetrating therethrough at a position corresponding to the outlet portion 202 of the lower plate 200a. The inlet communication holes 32, 203 and the outlet communication holes 104, 33 are formed for passing pipes therethrough to be used for allowing the coolant to flow when a plurality of the semiconductor cooling devices are to be stacked.

Further, a plurality of fastening bolt holes 105, 34, 204 are formed in the upper plate 100a, in the intermediate plate 3 and in the lower plate 200a at corresponding positions. The fastening bolt holes 105, 34, 204 are used for insertion of bolts at the time of stacking a plurality of semiconductor cooling devices. In the case of the upper plate 100b and the lower plate 200b obtained by plating the auxiliary plates 1 and 2 with copper on the surfaces of one side only thereof (see FIG. 3), too, working is effected by etching or by using a machining center in the same manner as described above. Further, the inlet communication holes 32, 203, outlet communication holes 104, 33, and fastening bolt holes 105, 34, 204, can be formed after the upper plate 100a (100b), intermediate plate 3 and lower plate 200a (200b) have been joined together.

Figure 5:
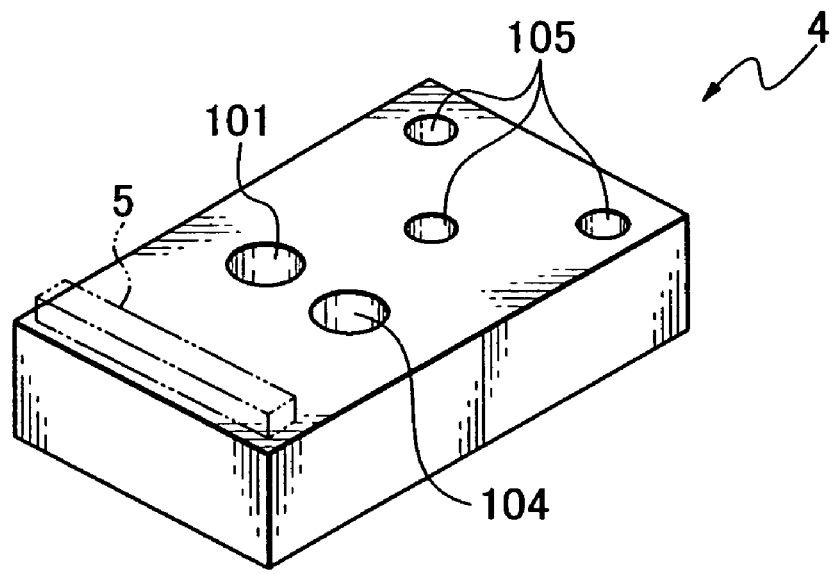
FIG. 5 is a perspective view of the semiconductor cooling device.

The upper plate 100a, intermediate plate 3 and lower plate 200a are joined together to obtain a semiconductor cooling device 4 shown in FIG. 5. The upper plate, intermediate plate and lower plate are pretreated prior to being joined together by using, for example, a gold-tin solder. The content of the pretreatment will be described below. The manner of pretreatment may slightly differ depending upon the case when the auxiliary plates 1 and 2 are plated with copper on both surfaces thereof and the case when the auxiliary plates 1 and 2 are plated with copper on the surfaces of one side only thereof. Therefore, the following description deals with the cases:

(1) When the auxiliary plates are plated with copper on the surfaces on both sides thereof, and (2) When the auxiliary plates are plated with copper on the surfaces of one side only thereof.

The intermediate plate 3 is made of copper and is treated in the same manner as that for the above case (1). In the example of FIG. 3(A), the method (1) is applied to the upper plate 100a and to the lower plate 200a. In the example of FIG. 3(B), the method (1) is applied to the upper plate 100a and the method (2) is applied to the lower plate 200b. In the example of FIG. 3(C), the method (2) is applied to the upper plate 100b and the method (1) is applied to the lower plate 200a. In the example of FIG. 3(D), the method (2) is applied to the upper plate 100a and to the lower plate 200a.

(1) When the auxiliary plates are plated with copper on the surfaces on both sides thereof, the upper plate 100a or the lower plate 200a to be pretreated is dewaxed with an alkali relying upon the electrolytic dewaxing with NaOH at an electric current density of, for example, 5 A/D$^2$ followed by washing with water. To remove the film of copper oxide, further, pickling the upper plate 100a or the lower plate 200a is carried out with hydrochloric acid, followed by washing with water.

Next, nickel strike plating is performed in the Wood's bath using a plating solution comprising nickel chloride as a chief component at an electric current density of, for example, 5 A/D$^2$. After washing with water, the nickel plating is effected until its thickness becomes, for example, about 1 µm in the Watts bath by using a plating solution comprising nickel chloride and nickel sulfate as chief components at an electric current density of 1 A/D$^2$.

After the washing with water, a gold strike plating is effected in a cyan bath at an electric current density of 2 A/D$^2$ followed by washing with water. Thereafter, the gold plating is performed until the thickness becomes about 2 to about 3 µm in the cyan bath at an electric current density of 1 A/D$^2$. The gold plating is for joining the intermediate plate 3 to the composite plates that constitute the upper plate 100a and the lower plate 200a. The pretreatment is thus finished.

(2) When the auxiliary plates are plated with copper on the surfaces of one side only thereof, the surfaces of the side that have not been plated with copper are treated. First, the upper plate 100b or the lower plate 200b to be pretreated is dewaxed with an alkali, followed by washing with water. The dewaxing with the alkali is conducted relying upon the electrolytic dewaxing with NaOH at an electric current density of, for example, 5 A/D$^2$. Next, the pickling thereof is carried out with hydrochloric add, followed by washing with water. Thereafter, the surfaces of the side that have not been plated with copper are etched by a predetermined amount, followed by washing with water and drying.

Next, the annealing is effected in a hydrogen atmosphere at about 850° C. and, then, the nickel strike plating is conducted. The nickel strike plating is conducted in the Wood's bath by using a plating solution comprising nickel chloride as a chief component at an electric current density of, for example, 5 A/D². After plating, the auxiliary plates are washed with water.

In order for the plated nickel to be adapted, the annealing is effected again in the hydrogen atmosphere at about 850° C. and, thereafter, the nickel strike plating is effected in the Wood's bath by using a plating solution comprising nickel chloride as a chief component at an electric current density of, for example, 5 A/D². The nickel strike plating is conducted as a pretreatment for the nickel plating to be conducted next Next, the nickel plating is conducted until the thickness becomes, for example, about 1 μm in the Watts bath by using a plating solution comprising nickel chloride and nickel sulfate as chief components at an electric current density of 1 A/D². After washed with water, the annealing is effected so that nickel plated herein and nickel plated by the nickel strike plating are adapted to each other.

Next, the gold strike plating is conducted in the cyan bath at an electric current density of 2 A/D², followed by washing with water. Thereafter, the gold plating is conducted until the thickness becomes about 2 to about 3 μm in the cyan bath at an electric current density of 1 A/D². The gold plating is for joining the intermediate plate 3 to the auxiliary plate 1 of the upper plate 100*b* and to the auxiliary plate 2 of the lower plate 200*b*. The pretreatment is thus finished.

The upper plate and the lower plate are pretreated by either one of the above method (1) or (2), and the intermediate plate 3, too, is treated in the same manner as in the above (1). That is, the intermediate plate 3, too, is pretreated in order of nickel strike plating→nickel plating→gold strike plating→gold plating.

Next, a gold-tin solder plate of about 10 μm to 30 μm thickness is worked into the shape of a contact surface between the upper plate 100*a* (100*b*) and the intermediate plate 3 and, similarly, a gold-tin solder plate of about 10 μm to 30 μm thickness is worked into the shape of a contact surface between the lower plate 200*a* (200*b*) and the intermediate plate 3. The thus worked two pieces of gold-tin solder plates are interposed between the upper plate 100*a* (100*b*) and the intermediate plate 3, and between the intermediate plate 3 and the lower plate 200*a* (200*b*), are fixed by the application of pressure by using a jig, and are heated at 300° C. to 400° C. for several tens of seconds so as to be integrated together to thereby obtain the semiconductor cooling device 4 as shown in FIG. 5.

Figure 6:
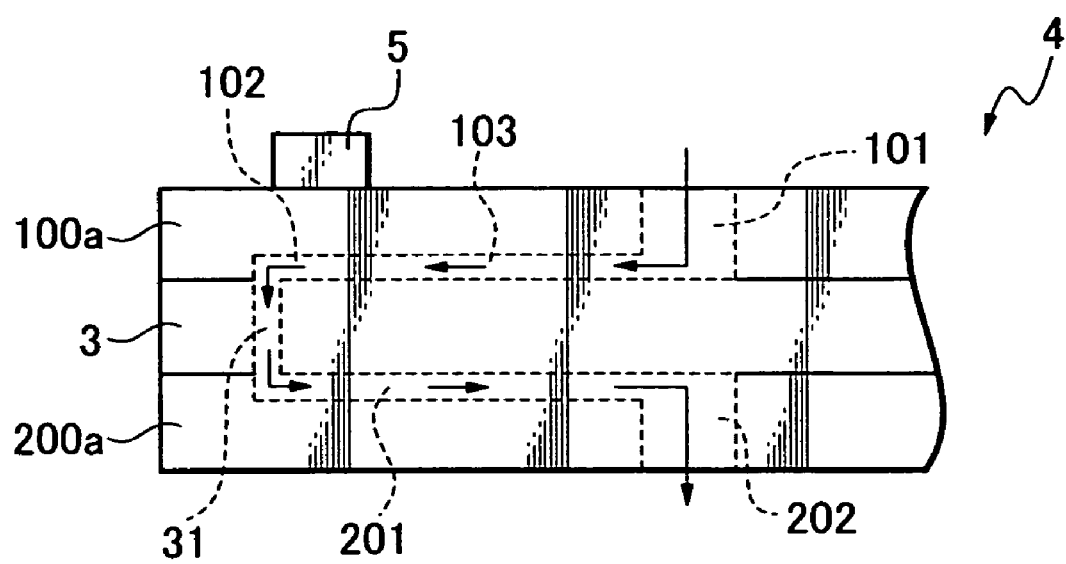
FIG. 6 is a schematic view illustrating the flow of a coolant.

A semiconductor chip 5 is mounted on the semiconductor cooling device 4 and is cooled. A position where the semiconductor 5 is mounted is just on the cooling portion 102 shown in FIG. 4. Referring to FIG. 6, the coolant introduced through the inlet portion 101 of the upper plate 100*a* arrives at the cooling portion 102 flowing through the flow-in passage 103 and cools the semiconductor chip 5 placed thereon. The coolant flows down the flow passage 31, flows through the discharge passage 201 in the lower plate 200*a*, and flows out from the outlet portion 202.

The material constituting the auxiliary plates 1 and 2 has a heat conductivity of as relatively good as 100 W/m·K or more (139 W/m·K in the case of, for example, molybdenum). Copper is plated on the exposed surface of the upper plate on which the semiconductor chip 5 is mounted and, hence, a high cooling effect is obtained for the semiconductor chip 5. Besides, the tensile strength, too, is as high as 1000 N/mm² (1370 N/mm² in the case of molybdenum) or more. Therefore, no distortion is produced while exhibiting a high cooling effect, and the semiconductor chip 5 can be supported maintaining stability. The operation of the semiconductor chip is not adversely affected. When the semiconductor chip is a semiconductor laser diode, in particular, no error occurs in the directivity of the laser beam.

Further, the constitutions of FIGS. 3(A), 3(B), 3(C) and 3(D) are symmetrical in the up-and-down direction with copper constituting the intermediate plate 3 as a center or with copper and plated copper constituting the intermediate plate as a center. This offsets the bimetal effect that stems from a difference in the coefficient of thermal expansion between copper and the material of the auxiliary plates. Accordingly, the semiconductor cooling device 4 is not curved, and the operation of the semiconductor chip is not adversely affected.

Further, when the semiconductor chip is made of gallium arsenide and the auxiliary plates 1 and 2 are made of molybdenum, copper can be suppressed from thermally expanding since the coefficient of thermal expansion of gallium arsenide is 5.9 ppm/° C. while the coefficient of thermal expansion of molybdenum is as low as 5.1 ppm/° C. preventing the semiconductor chip from being separated away after the passage of time.

It can be contrived to form the composite plate by holding an auxiliary plate made of molybdenum or copper-tungsten between the plates made of copper, and integrally joining them together by the thermal diffusion, or by holding an auxiliary plate between the plates made of copper via a gold-tin solder or the like, and sintering them so as to be integrally joined together. However, these methods are accompanied by such problems that the air partly enters into the junction portion to form voids and the conduction of heat is locally shut off causing the cooling effect to decrease and that the auxiliary plate and the copper plate peel off from each other after the passage of time. According to the present invention, on the other hand, the composite plate is constituted by the metal plating without forming voids at the junction portions and, hence, without giving rise to the above problems.

Figure 7:
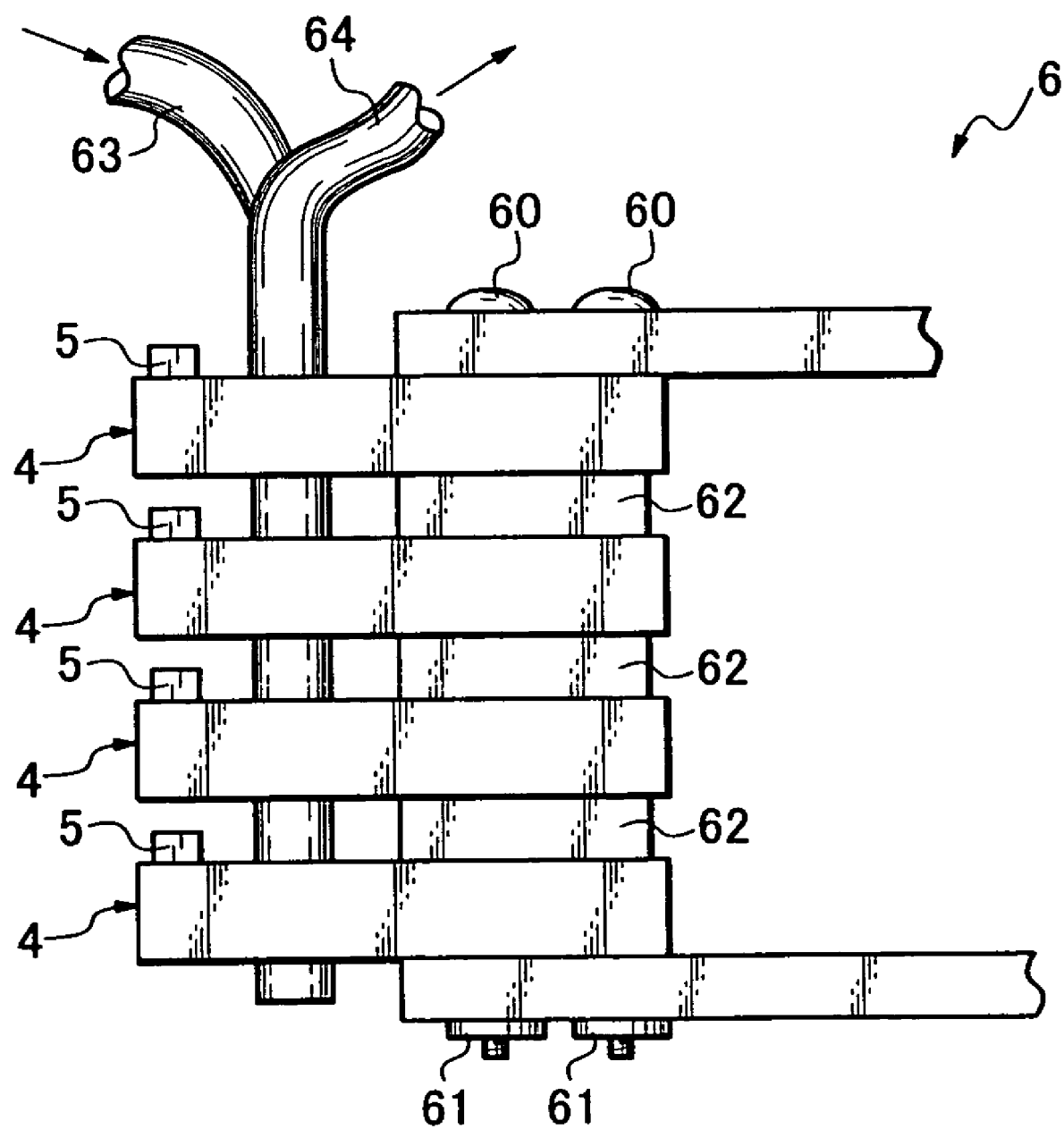
FIG. 7 is a front view showing a stack of semiconductor cooling devices.

A stack 6 of the semiconductor cooling devices shown in FIG. 7 is obtained by stacking a plurality of the semiconductor cooling devices 4 shown in FIG. 5, inserting bolts 60 in the fastening bolt holes 105, 34, 204 (see FIG. 4), and fastening them together by using nuts 61. The semiconductor chips 5 are mounted on the upper plates of the semiconductor cooling devices 4 respectively. Further, spacers 62 are interposed among the semiconductor cooling devices 4 to maintain space for mounting the semiconductor chips 5. A first pipe 63 and a second pipe 64 are penetrated through the semiconductor cooling devices 4 in the up-and-down direction.

Figure 8:
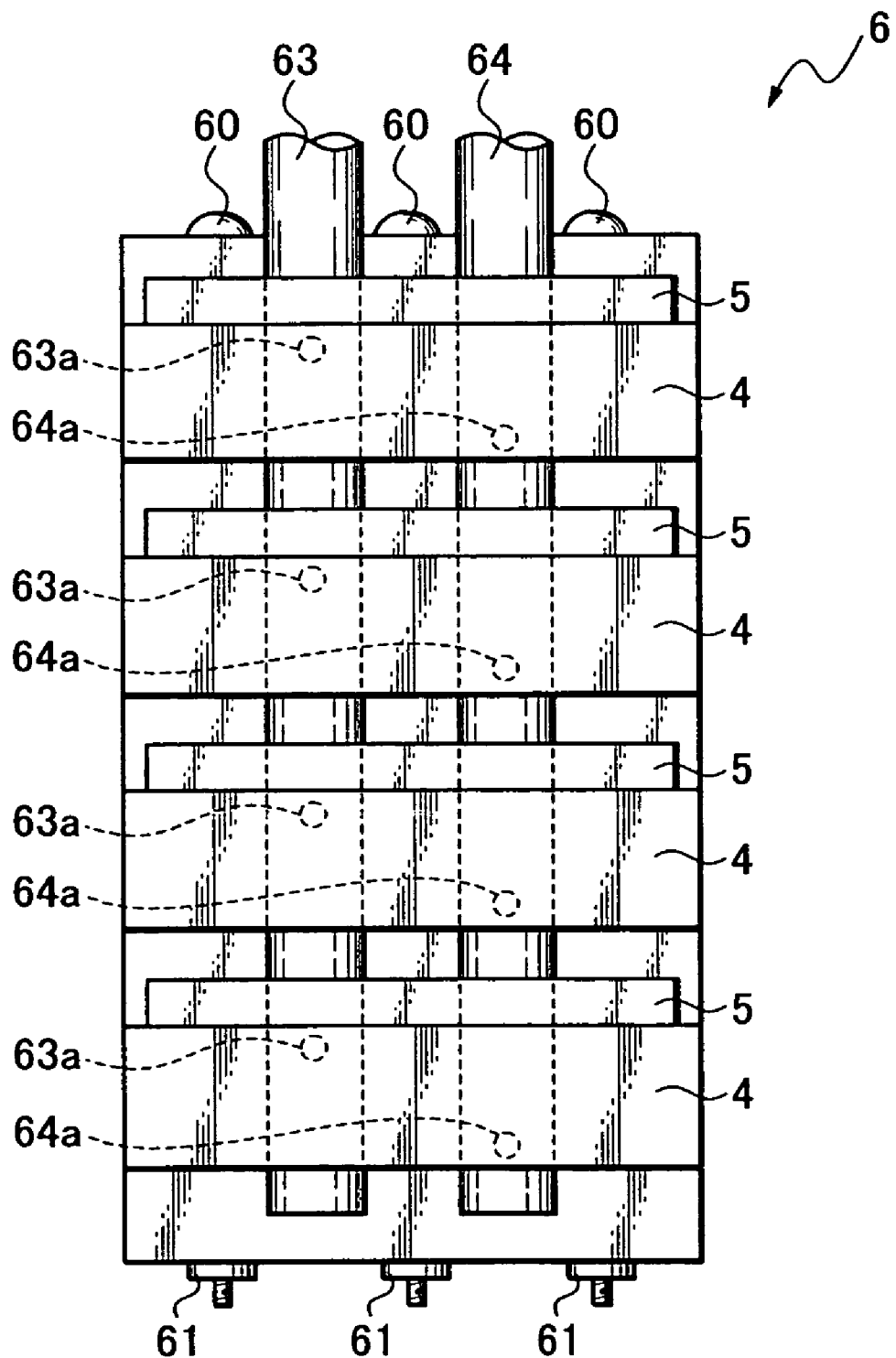
FIG. 8 is a side view showing the stack of semiconductor cooling devices.

As shown FIG. 8, the first pipe 63 is penetrated through the inlet portion 101 and the inlet communication holes 32, 203 (see FIG. 4) of each semiconductor cooling device 4. Referring to FIGS. 4 and 8, the first pipe 63 has a flow-out hole 63*a* formed at the height of inlet portion 101 of the upper plate 100*a* (100*b*). Through the inlet portion 101, the coolant flows into the flow-in passage 103 from the flow-out hole 63*a* and fills the cooling portion 102 (see FIG. 4) to cool the semiconductor chip 5. The coolant that does not flow out through the flow-out hole 63*a* flows down the pipe 63, flows out from another flow-out hole 63*a* on the lower side and flows to cool another semiconductor chip 5.

Further, the second pipe 64 is penetrated through the outlet portion 202 and the outlet communication holes 34, 104 of the semiconductor cooling devices 4. The first pipe 64 has a flow-in hole 64*a* formed at the height of outlet portion 202 of the lower plate 200*a* (200*b*). Through the outlet portion 202, the coolant flows into the flow-in hole 64*a* after having effected the cooling through the cooling portion 102, and rises through the second pipe 64 and is discharged to the outer side.

As described above, the coolant flows to the outer side after flowing through the interiors of the semiconductor cooling devices 4 to cool all semiconductor chips 5. Each semiconductor cooling device 4 constituting the stack 6 of semiconductor cooling devices is not distorted by the fastening force of bolts 60. When the semiconductor chips 5 are the semiconductor laser diodes, therefore, the directivity of the laser beams is maintained constant at all times enabling the output to be increased.

The present invention can be utilized for supporting the semiconductor chips maintaining stability while cooling the semiconductor chips that generate heat

What is claimed is:

1. A stack of semiconductor cooling devices constituted by stacking a plurality of semiconductor cooling devices and by fastening the stack of the devices by bolts, wherein:
   each semiconductor cooling device includes at least an upper plate, an intermediate plate and a lower plate, and has a coolant inlet portion, an outlet portion and a flow passage portion;
   a semiconductor laser diode is mounted as a semiconductor chip on each semiconductor cooling device; and
   the upper plate and the lower plate are composite plates constituted by plating copper maintaining a thickness of not smaller than 0.05 mm on one surface or on both surfaces of auxiliary plates made of a material having a tensile strength of not smaller than 1000 N/mm$^2$, a heat conductivity of not smaller than 100 W/m·K and a coefficient of thermal expansion of not larger than 6.0 ppm/°C.

2. A stack of semiconductor cooling devices according to claim 1, wherein copper is plated maintaining a thickness of 0.1 mm to 0.5 mm, and the auxiliary plates have a thickness of 0.1 mm to 0.5 mm.

3. A stack of semiconductor cooling devices according to claim 1, wherein a material of the auxiliary plates is molybdenum.

4. A stack of semiconductor cooling devices according to claim 3, wherein the semiconductor chip is made of gallium arsenide.

5. A stack of semiconductor cooling devices according to claim 1, wherein the intermediate plate is made of copper, and the composite plates have copper-plated surfaces that are exposed to the outer side.

* * * * *